(12) United States Patent
Kearns et al.

(10) Patent No.: US 7,743,659 B2
(45) Date of Patent: Jun. 29, 2010

(54) STRUCTURAL HEALTH MONITORING (SHM) TRANSDUCER ASSEMBLY AND SYSTEM

(75) Inventors: Justin D. Kearns, Seattle, WA (US); David M. Anderson, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 517 days.

(21) Appl. No.: 11/754,167

(22) Filed: May 25, 2007

(65) Prior Publication Data

US 2008/0289426 A1 Nov. 27, 2008

(51) Int. Cl.
*G01N 29/24* (2006.01)

(52) U.S. Cl. .......................................... 73/632

(58) Field of Classification Search ............... 73/632
See application file for complete search history.

(56) References Cited

U.S. PATENT DOCUMENTS

| 5,184,516 | A * | 2/1993 | Blazic et al. .................. 73/799 |
| 6,370,964 | B1 * | 4/2002 | Chang et al. ............ 73/862.046 |
| 2006/0079747 | A1 * | 4/2006 | Beard et al. .................. 600/407 |

FOREIGN PATENT DOCUMENTS

| WO | 2003035281 | 5/2003 |
| WO | 2005084358 | 9/2005 |
| WO | 2006041513 | 4/2006 |
| WO | WO 2006/036895 | 4/2006 |

OTHER PUBLICATIONS

Xinlin Qing et al.; A hybrid piezoelectric/fiber optic diagnostic system for structural health monitoring; Institute of Physics, Smart Materials and Structures; 2005, pp. S98-S103, 14; IOP Publishing Ltd.

Dimitry Gorinevsky et al.; Design of Integrated SHM System for Commercial Aircraft Applications; 5th International Workshop on Structural Health Monitoring; 2005, Stanford, CA.

Ghasemi-Nejhad, M. et al. "Manufacturing and testing of active composite panels with embedded piezoelectric sensors and actuators." Journal of Intelligent Material Systems and Structures, Technomic Publ., Lancaster, PA, US, vol. 16, No. 4, Apr. 1, 2005, pp. 319-333.

International Search Report, corresponding to International Patent Application No. PCT/US2008/064545, dated Nov. 7, 2008.

Written Opinion, corresponding to International Patent Application No. PCT/US2008/064545, dated Nov. 7, 2008.

* cited by examiner

*Primary Examiner*—Hezron Williams
*Assistant Examiner*—Rose M Miller
(74) *Attorney, Agent, or Firm*—Charles L. Moore; Moore & Van Allen, PLLC

(57) ABSTRACT

A transducer assembly may include a first layer of dielectric material and a pair of electrically conductive traces adjacent to the first dielectric layer. Each of the electrically conductive traces may include a first contact pad and a second contact pad. The first layer of dielectric material may include a pair of vias or openings formed therein to expose each of the first contact pads. A second layer of dielectric material may be attached to the first layer of dielectric material with the pair of electrically conductive traces disposed between the first and second layers of dielectric material. A transducer may be attached to the second layer of dielectric material and each second contact pad may be electrically connected to the transducer.

29 Claims, 4 Drawing Sheets

STRUCTURAL HEALTH MONITORING (SHM) TRANSDUCER ASSEMBLY AND SYSTEM

BACKGROUND OF THE INVENTION

The present invention relates to monitoring structural health of an object, such as an aircraft or other vehicle, and more particularly to a structural health monitoring (SHM) transducer assembly and system that may utilize the SHM transducer assembly.

New, lightweight composite materials, traditional metallic materials, and other materials are being used and optimized in designs more extensively in the aerospace industry for commercial aircraft and other aerospace vehicles, as well as in civil infrastructure, ground transportation, and other industries. The new materials and new designs may be subject to extreme stresses or potential damage from an impact or other cause. For example near a fuselage cargo door surround of a commercial aircraft, baggage handlers often inadvertently collide with and cause impact damage to the airplane fuselage. Any such damage needs to be quickly and efficiently identified, located, and the size and extend determined so that any needed repairs can be performed and to reduce airplane maintenance costs and eliminate airplane cancellation and delays. To implement quick non-destructive evaluations that may be performed quickly to ensure minimal maintenance times, numerous transducers are required. To add such a new inspection system to an airplane or other structure with harsh in-service environments and cost competitiveness, the transducers must be low cost, be able to survive in harsh environments, and perform well over time.

BRIEF SUMMARY OF THE INVENTION

In accordance with an embodiment of the present invention, a transducer assembly may include a first layer of dielectric material and a pair of electrically conductive traces adjacent to the first dielectric layer. Each of the electrically conductive traces may include a first contact pad and a second contact pad. The first layer of dielectric material may include a pair of vias or openings formed therein to expose each of the first contact pads. A second layer of dielectric material may be attached to the first layer of dielectric material with the pair of electrically conductive traces disposed between the first and second layers of dielectric material. A transducer, sensor or the like may be attached to the second layer of dielectric material and each second contact pad may be electrically connected to the transducer. In another embodiment of the present invention, a third layer of dielectric material may be bonded to the bottom of the transducer covering the full bottom surface of the transducer (the bottom of the transducer disk and a portion of the second layer of dielectric material)

In accordance with another embodiment of the present invention, a transducer assembly may include a polyimide film and a pair of electrically conductive traces bonded to the polyimide film. Each of the electrically conductive traces may include a first contact pad and a second contact pad. The polyimide film may include a pair of vias or openings formed therein to expose each of the first contact pads for connection to a structural health monitoring unit. A layer of non-conductive adhesive may be attached to the polyimide film and encapsulate the electrically conductive traces in association with the polyimide film. The transducer assembly may also include a flat electromechanical transducer. The layer of non-conductive adhesive may be adapted to attach the flat electromechanical transducer to the polyimide film such that a signal transmitting face of the flat electromechanical transducer forms a substantially flat surface with the non-conductive adhesive layer to prevent any voids when the transducer assembly is attached to an object for actuating and sensing or other monitoring. A pair of electrically conductive adhesive patches may separately connect each of the two contact pads of the electrically conductive traces to the flat electromechanical transducer through a hole in the layer of non-conductive adhesive.

In accordance with another embodiment of the present invention, a system for structural health monitoring may include a structural health monitoring unit. The system may also include a plurality of structural health monitoring transducer assemblies connected to the structural health monitoring unit to send stress waves into an object being monitored and to receive return stress waves from the object for monitoring the structural health of the object. Each structural health transducer assembly may include a polyimide film and a pair of electrically conductive traces attached to the polyimide film. Each of the electrically conductive traces may include a first contact pad and a second contact pad. The polyimide film may include a pair of vias or openings formed therein to expose each of the first contact pads for connection to the structural health monitoring unit. A layer of non-conductive adhesive may be attached to the polyimide film and encapsulate the electrically conductive traces in association with the polyimide film. Each transducer assembly may also include a transducer, sensor or the like. The layer of non-conductive adhesive may be adapted to attach the transducer to the polyimide film such that a signal transmitting face of the transducer forms a substantially flat surface with the non-conductive adhesive layer to prevent any voids when the transducer assembly is attached to an object for structural health monitoring. A pair of electrically conductive adhesive patches may separately connect each of the two contact pads of the electrically conductive traces to the transducer through holes in the layer of non-conductive adhesive.

In accordance with another embodiment of the present invention, a method for forming a transducer assembly may include providing a first layer of dielectric material and placing a pair of electrically conductive traces adjacent to the first dielectric layer. Each of the electrically conductive traces may include a first contact pad and a second contact pad. The method may also include forming a pair of vias or openings in the first layer of dielectric material to expose each of the first contact pads. The method may also include attaching a second layer of dielectric material to the first layer of dielectric material with the pair of electrically conductive traces disposed between the first and second layers of dielectric material. The method may further include attaching a transducer to the second layer of dielectric material, wherein each second contact pad is electrically connected to the transducer.

Other aspects and features of the present invention, as defined solely by the claims, will become apparent to those ordinarily skilled in the art upon review of the following non-limited detailed description of the invention in conjunction with the accompanying figures.

DETAILED DESCRIPTION OF THE INVENTION

Figure 1A:
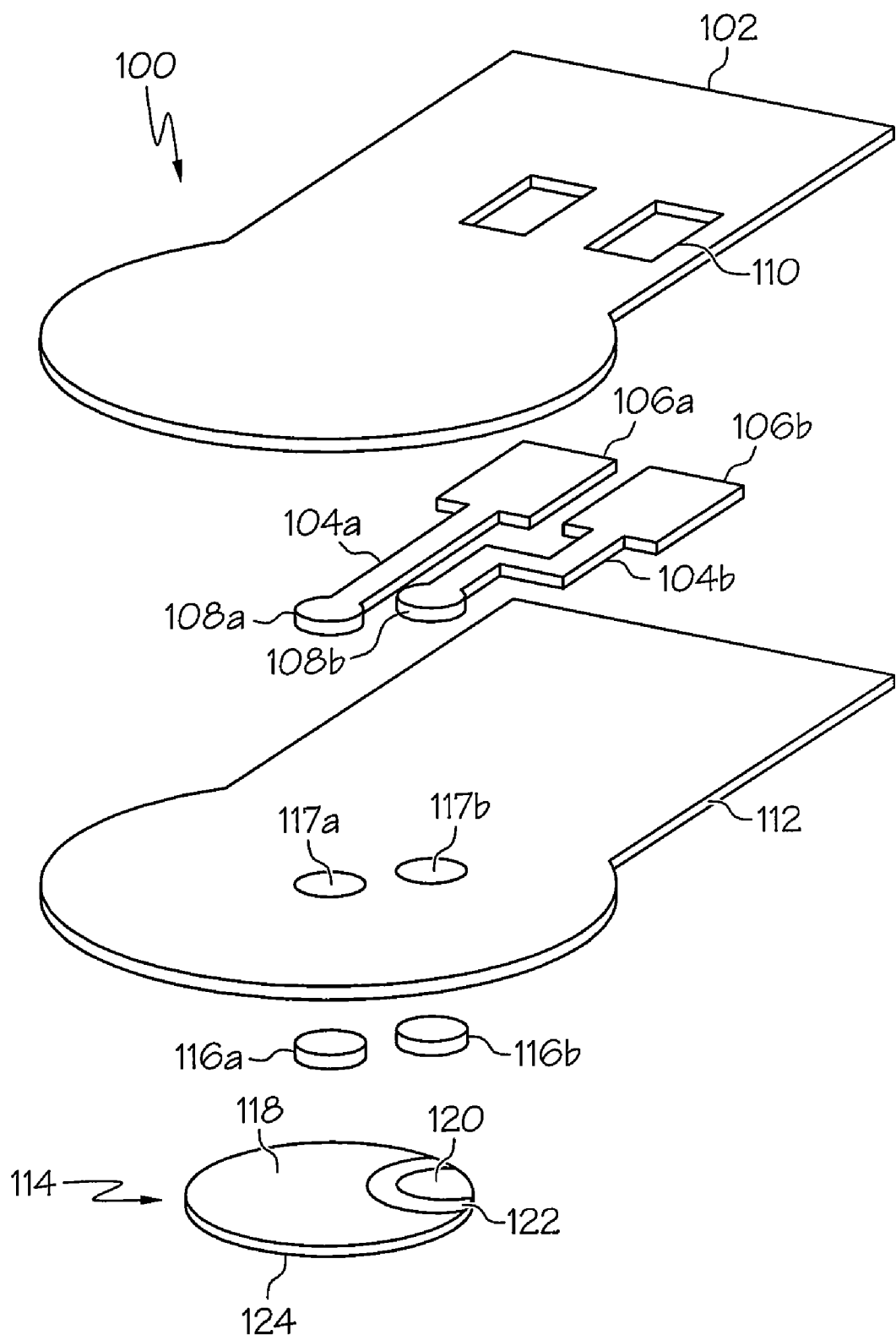
FIG. 1A is an exploded view of an example of a transducer assembly that may be used for structural health monitoring in accordance with an embodiment of the present invention.

The following detailed description of embodiments refers to the accompanying drawings, which illustrate specific embodiments of the invention. Other embodiments having different structures and operations do not depart from the scope of the present invention.

FIG. 1 is an exploded view of an example of a transducer assembly 100 that may be used for structural health monitoring in accordance with an embodiment of the present invention. The transducer assembly 100 may include a first layer 102 of dielectric material. The first layer 102 of dielectric material may be a polyimide film or similar flexible non-conductive material. The first layer may have a thickness of about 7.5 mils or less. The polyimide film or first layer 102 may be Dupont Pyralux LF9150 or a similar material. Pyralux is a trademark of E.I. Du Pont De Nemours and Company in the United States, other countries or both.

A pair of electrically conductive traces 104 may be disposed adjacent to, bonded to or attached by other means to the first dielectric layer 102 or polyimide film, as is the case with Dupont Pyralux LF9150 and various polyimide-copper laminated materials. The material of layer 102 may also be a non-conductive composite material with bonded copper traces 104, such as a resin impregnated fiberglass fabric. Each conductive trace 104 may be one of the following copper or similar conductive material, conductive silk-screened ink, and a bundle of conductive, conductively coated semi-conductive or conductively coated non-conductive fibers. Each conductive trace 104 may include a first contact pad 106 and a second contact pad 108. The first dielectric layer 102 may include a pair of vias 110 or opens formed therein to expose each of the first contact pads 106 to provide a wiring interface to connect the traces 104 to a structural health monitoring unit (not shown in FIG. 1A) or similar device. The vias 110 may be formed by a laser ablatement process or other process capable of precisely forming such openings 110.

A second layer 112 of dielectric material may be attached to the first layer 102 of dielectric material with the pair of electrically conductive traces 104 disposed between the first and second layers 102 and 112 of dielectric material. An electromechanical transducer 114 may be attached to the second layer 112 of dielectric material on an opposite side of the second layer 112 relative to the first layer 102 of dielectric material. Each second contact pad 108 may be electrically connected to the electromechanical transducer 114 through the second layer 112 of dielectric material.

The second layer 112 of dielectric material may include a layer of non-conductive adhesive to encapsulate the electrically conductive traces 104 and to attach the electromechanical transducer 114 to the first layer 102 of dielectric material or polyimide film. Each of the two contact pads 108 of each of the conductive traces 104 may be electrically connected through holes 117 in the second layer 112 of non-conductive dielectric material by an electrically conductive adhesive film 116, adhesive patch or adhesive in a paste form.

The layer of non-conductive adhesive 112 may have a thickness of about 4 mils or less. The layer of non-conductive adhesive 112 may be Ablefilm CF563 or a similar non-conductive adhesive. The electrically conductive adhesive film 116 or patch may also have a thickness of about 4 mils or less. The electrically conductive adhesive film 116 may be an epoxy film, such as Ablefilm CR3350 or a similar conductive film. Ablefilm is a trademark of National Starch and Chemical Investment Holding Corporation of New Castle, Del. in the United States, other countries or both. Conductive adhesive electrical bonds 116 are attached to transducer 114 by connecting to electrical pads 118 and 120. Note that electrical pads 118 and 120 on the disk or transducer 114 are separated by an electrically isolating non-conductive layer 122. Conductive adhesive bond 116 also connects to pads 108.

The electromechanical transducer 114 may be a flat ceramic piezoelectric ultrasonic transducer disk, sensor or a similar device capable of transmitting stress waves in a structure or object under test as described herein. As used herein transducer may also mean sensor or any device for performing the functions described herein. The electromechanical transducer disk 114 may have a thickness of about 10 mils or less. The electromechanical transducer 114 may be a 10 mil lead, zirconate, titanate piezoelectric ceramic material with electrically conductive, yet separately isolated plates attached or bonded to each side of the piezo disk such as piezo materials from APC International, Ltd.

The electromechanical transducer 114 may include a signal transmitting face 124 opposite to the non-conductive layer 112. When the signal transmitting surface 124 is bonded to an object, the piezo material is able to be excited sending stress waves into the object and/or able to receive return stress waves from the object for monitoring the structural health of the object or to detect any anomalies in the object. As described in more detail herein with reference to FIG. 3, the stress waves may be ultrasonic lamb waves or similar waves to detect any anomalies, defect or damage.

Figure 3:
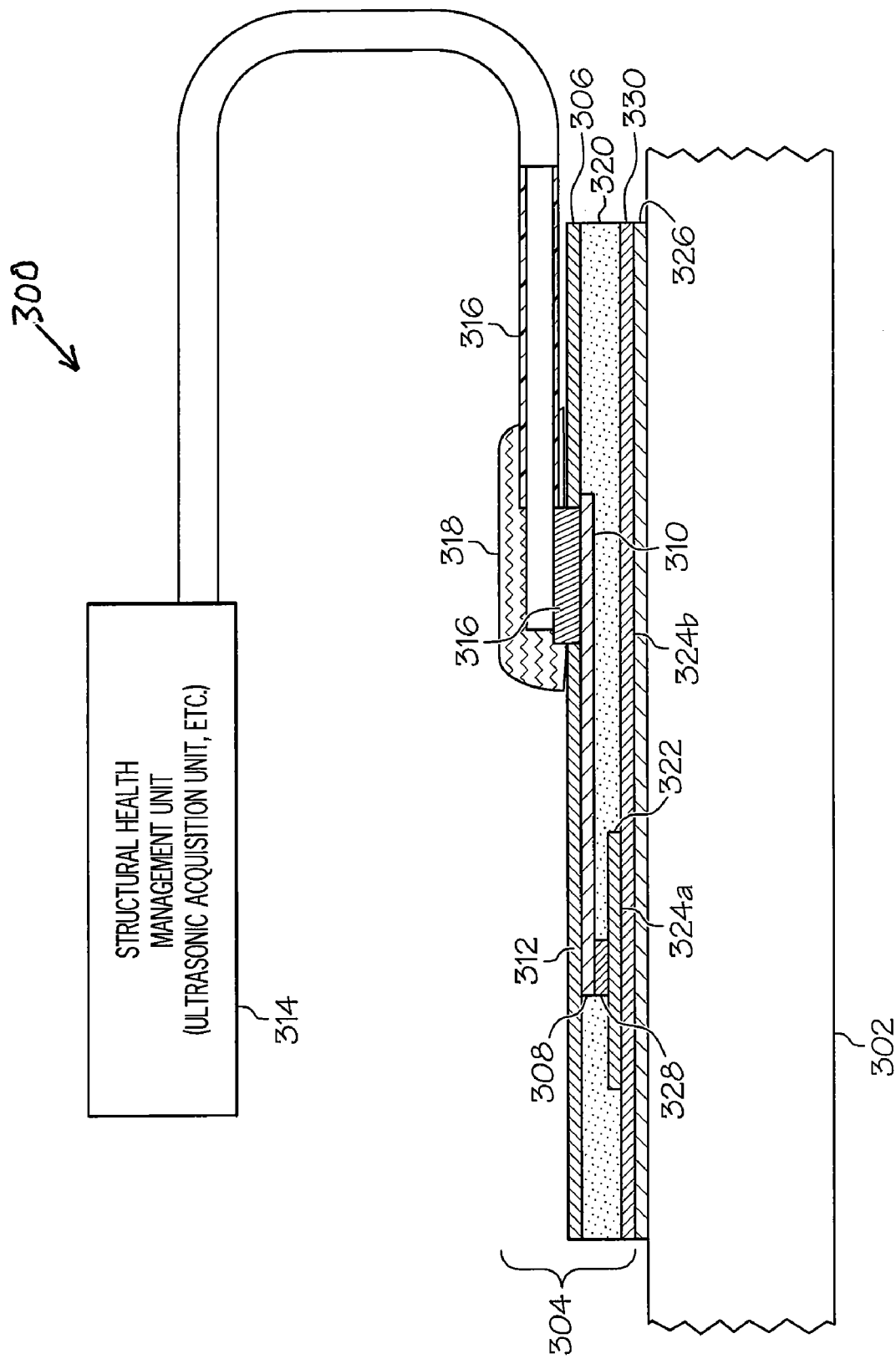
FIG. 3 is a cross-sectional view of the transducer assembly of FIG. 1B taken along lines 3-3 included in an exemplary system for structural health monitoring of an object, such as a vehicle or the like, in accordance with an embodiment of the present invention.

The second layer 112 of non-conductive material may be an adhesive or combination of dielectric material and adhesive with holes and conductive adhesive film patches 116 extending through the holes 117 in the second layer 112 are adapted to assist in attaching or holding the electromechanical transducer 114 to the first layer 102 of dielectric material or polyimide film. The attachment of the electromechanical transducer 114 is such that the signal transmitting face 124 forms a substantially flat or planar surface with the non-conductive adhesive layer 112 to prevent any voids or substantial steps when the transducer assembly 100 is attached to an object for structural health monitoring or to detect any anomalies. FIG. 3 illustrates an example of a transducer assembly 304, similar to the transducer assembly 100, attached to an object 302 being monitored without any voids or substantial steps between the transducer assembly 304 and the object 302. The non-conductive layer 320 (112 in FIG. 1A) is formed to be flat with the electromechanical transducer 322 as shown in FIG. 3 (114 in FIG. 1A). This flatness provides a tight seal around the edges of the transducer 322 as shown in FIG. 3.

The transducer assembly 100 may be attached to an object for structural health monitoring without any additional structural layers or thick components. Only a thin layer of electrically conductive adhesive or non-conductive adhesive 326 as shown in FIG. 3 is used to bond the transducer assembly 322 (as shown in FIG. 3) which may be the same as transducer assembly 100 in FIG. 1A. This described electromechanical transducer assembly 100 bonding method provides a substantially flat, low profile structure when attached to the object 302 to substantially prevent any inadvertent impacts to the transducer assembly that may result in possible damage to the transducer assembly. Additionally, the simple, minimal layer structure minimizes mechanical impedance mismatch and increases signal-to-noise ratio during structural health monitoring. The substantially flat bottom surface provides a surface that contributes to uniform bonding of the transducer assembly to the object or structure to which the transducer will be applied.

As described above, the simplistic structure of the transducer or sensor assembly 100 of the embodiment of the present invention illustrated in FIG. 1A can be inexpensively and efficiently fabricated as described in more detail with reference to FIG. 2. The low fabrication costs may permit a multiplicity of such transducer or sensor assemblies to be deployed on an aircraft at selected locations, or on any structure as part of a structural health monitoring program.

Figure 2:
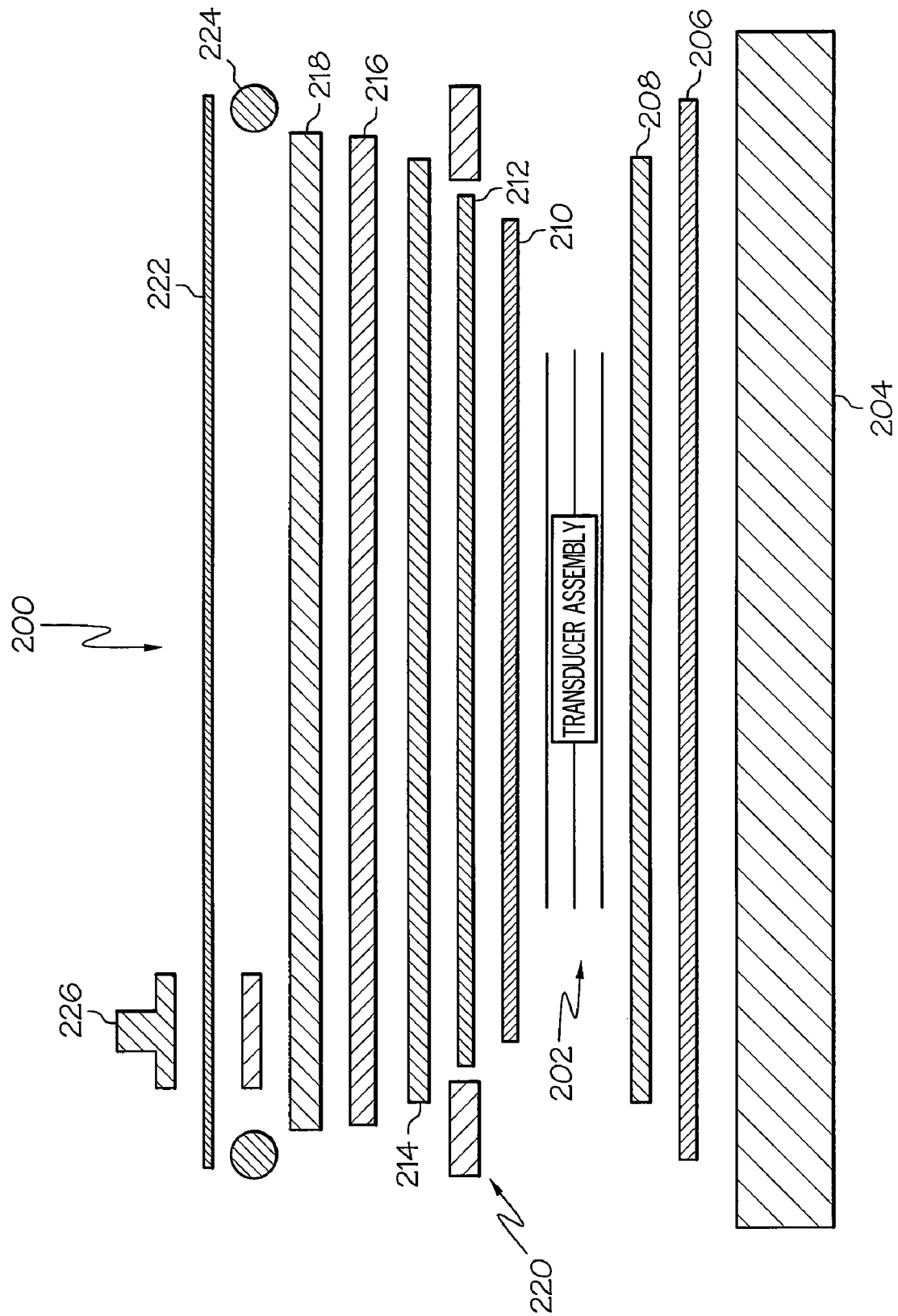
FIG. 2 is an illustration of an example of a lay-up configuration for forming a transducer assembly in accordance with an embodiment of the present invention.

FIG. 2 is an illustration of an example of a lay-up configuration 200 for forming a transducer assembly 202 in accordance with an embodiment of the present invention. The transducer assembly 202 may be the same as the transducer assembly 100 in FIG. 1A. The uncured transducer assembly 202 may be disposed on or in an autoclave tool 204. A first separator sheet 206 of heat resistant, non-stick material and a peel ply or layer 208 of release material may be placed or disposed between the transducer assembly 202 and the autoclave tool 204. The first separator sheet 206 of heat resistant, non-stick material may be a solid sheet of fluorinated ethylene propylene (FEP) or similar heat resistant, non-stick material. The release material layer 208 may be any type of peel ply material or the like. The first separator sheet 206 and release material layer 208 or peel ply will permit the transducer assembly 202 to be easily removed from the autoclave tool 204 after curing.

A temperature tape 210 may be placed on an opposite side of the uncured transducer assembly 202 relative to the autoclave tool 204. The temperature tape 210 may be any type of adhesive material to maintain the relative positioning of the different plies of the uncured transducer assembly 202 with respect to each other while in an uncured state. A second separator sheet 212 may be placed on the temperature tape 210. The second separator sheet 212 may be a perforated FEP separator or a similar layer of material that will permit a full vacuum to be applied to the transducer assembly 202 and permit removal of the transducer assembly 202 after curing.

A bleeder sheet 214 may be placed on the second separator sheet 212. The bleeder sheet 214 may be a 120# fiberglass bleeder or similar mechanism to permit the full vacuum to be applied to the transducer assembly 202. A third separator sheet 216 may be placed on the bleeder sheet 214. The third separator sheet 216 may be a solid FEP separator layer. An airweave breather 218 may be placed on the third separator sheet 216. Again, the airweave breather 218 and perforated separator sheet 216 permit the vacuum to be applied to the transducer assembly 202 and the perforated separator 216 facilitates removal of the assembly 202 after curing.

The layered configuration 220 may be placed in a vacuum chamber or bag 222 and sealed. The vacuum bag 222 may be sealed with tape 224, such as tacky tape or similar adhesive or other suitable means. A full vacuum may be applied to the configuration 220 through a vacuum port 226.

The uncured transducer assembly 202 may be cured using a predetermined cure schedule to cause the cured transducer assembly 202 to be substantially free of any air pockets and resin rich areas. For example, a full vacuum may be applied to the transducer assembly 202 during curing. A curing temperature may be applied to the transducer assembly 202 and may be ramped up at about 20 degrees Fahrenheit (F) per minute from an ambient temperature to about 300 degrees F. The curing temperature may be held at about 300 degrees F. for about 30 minutes. After about 30 minutes, the curing temperature may be ramped down at about 20 degrees F. per minute to the ambient temperature.

As a result of the high temperature and pressure cure, many benefits ensue including a transducer assembly consisting of a flat interface surface, uniform, and rugged structure to substantially prevent damage due to inadvertent impacts to the transducer assembly 202 resulting in possible damage. Some other benefits to this design and cure schedule may include good signal performance with high strength of signal by way of maximizing structural stress transmission into and from the piezoelectric disk and thus transmitting lamb waves efficiently into an object under test or being monitored, such as object 302 in FIG. 3. The flat surface between piezo disk 322 and adhesive 320 are visible in FIG. 3. The compact and efficient design of the transducer helps minimize mechanical impedance mismatch and minimizes noise to help provide a high signal-to-noise ratio during transducer usage. When bonded to an object, such as 302 in FIG. 3, full encapsulation of the piezoelectric disk or sensor and circuitry (as surrounded by adhesive 320) provides additional protection against harsh environmental conditions such as moisture, freeze/thaw cycles, and chemical spillage. The larger-than-piezo-disk, flat, and uniform bonding surface of the transducer helps in the bonding process to ensure a uniform void free bond when the transducer is bonded to a structure and helps minimize stress concentrations, protecting against structural static and fatigue failures, acoustic vibration failures, and electromechanical interference (EMI) exposure, and incidental damage due to impact of the transducer. The non-conductive ply 112 in FIG. 1A ensures isolation between conductor (signal) and ground to avoid short-circuits. The conductive ply or patches 116 ensure guaranteed electrical connection between electrical path and piezoelectric transducer disk 114. The transducer assembly as shown 100, 202 and 304 may have an additional layer of material (not shown) between transducer 304 and bonding adhesive 326. This material layer will help electrically isolate the transducer 304 from the structure 302. Transducer bonding adhesive 326 may be a non-conductive or conductive adhesive; thus helping to provide a transducer 304 that is grounded or isolated from the structure 302. As shown in FIG. 3, the conductive or non-conductive adhesive 326 after curing will provide electrical isolation or electrical conductivity between the transducer disk 304 and any object or structure 302 to which the transducer 304 is bonded. For the case of electrical isolation, the isolation between the transducer 304 and the structure 302 is due to the fact that the substantially flat bottom design interface extends over material 320 and disk 322 of the transducer assembly 304 allowing for a consistent, uniform bondline between the transducer disk 322 and any object or structure being monitored 302.

If full electrical isolation between the transducer assembly 304 and the structure 302 is desired, an optional, thin (approximately 4 mils or less) non-conductive isolation layer 330 may be added to the bottom of the transducer assembly as shown in FIG. 3. The non-conductive isolation layer may be non-conductive resin; and the resin may be reinforced such as with a thin non-conductive fabric made from non-conductive fiber tows. The non-conductive fiber reinforcement used may be glass or other non-conductive fibers. In another embodiment of this invention the non-conductive layer 330 may also have micro non-conductive beads or other non-conductive thickness-controlling or spacing material added to the non-conductive resin (layer 330) to help ensure a uniform thickness for layer 330 and electrical isolation.

Figure 1B:
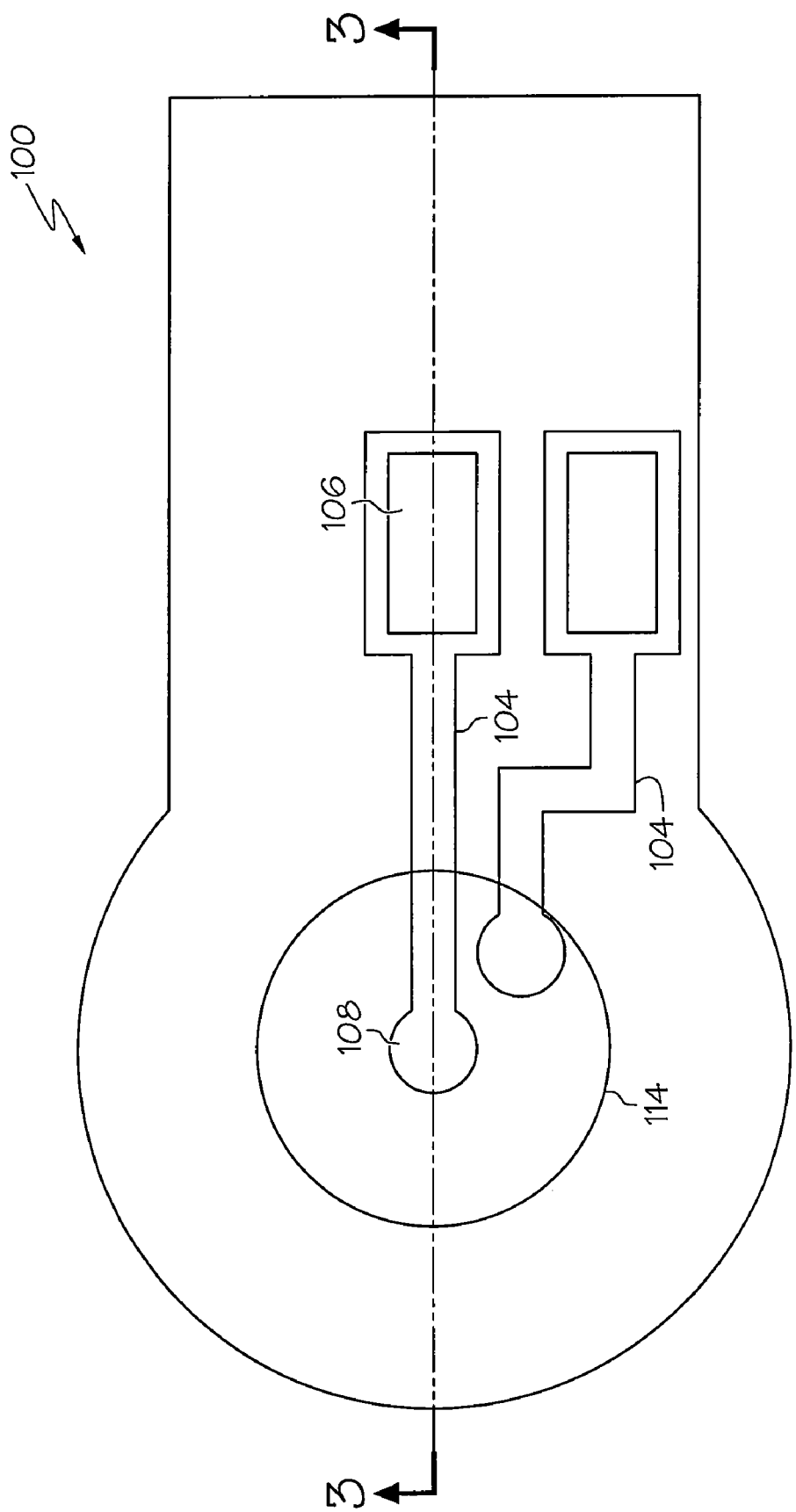
FIG. 1B is a plan view of the transducer assembly of FIG. 1A.

FIG. 3 is a cross-sectional view of the transducer assembly 100 of FIG. 1B (304 in FIG. 3) taken along lines 3-3 included in an exemplary system 300 for structural health monitoring of an object 302, such as a vehicle or the like, in accordance with an embodiment of the present invention. The object 302 may be an aerospace vehicle, terrestrial vehicle, watercraft, civil structure, such as a bridge, deck or railway, or other type vehicle or structure. The system 300 may include a plurality of transducer or sensor assemblies 304 located at predetermined positions on the object 302. A cross-sectional view of a single transducer assembly 304 is illustrated in FIG. 3 for purposes of explaining the present invention. The transducer assembly 304 may be similar or the same as the transducer assembly 100 of FIGS. 1A and 1B. Accordingly, the transducer assembly 304 may include a polyimide film 306. A pair of electrically conductive traces 308 may be bonded to the polyimide film 306. Each conductive trace 308 may be similar to conductive traces 104 in FIG. 1A. Accordingly, each of the conductive traces 308 may include a first contact pad 310 and a second contact pad 312. The polyimide film may have a pair of vias or openings formed therein, similar to vias 110 in FIG. 1A, to expose each of the first contact pads 310 for connection to a structural health monitoring unit 314. Each of the first contact pads 310 may be connected to the structural health monitoring unit 314 by a suitable connection means 316, such as a connector wire electrically bonded using solder to each first contact pad 310, a wire electrically bonded and attached to each contact pad 310 by a conductive adhesive, or other means suitable for the particular application of the transducer assembly 304 and the object 302 being monitored. An electrical insulating and sealing potting compound 318 or other suitable material may be deposited on each first contact pad 310 and connection thereto to seal the transducer assembly 304 from environmental conditions.

A layer or ply 320 of non-conductive adhesive may be attached to the polyimide film 306 with the electrically conductive traces 308 encapsulated between the non-conductive layer 320 and the polyimide film 306. Similar to that previously described, the non-conductive layer 320 may be adapted to attach a flat electromechanical transducer 322 or piezoelectric transducer, sensor or disk to the polyimide film 306 such that a signal transmitting face 324a of the piezoelectric disk or transducer 322 will form a substantially flat or planar surface with the non-conductive adhesive layer 320 to prevent any voids or steps when the transducer assembly 304 is attached to the object 302. This provides good mechanical or acoustic coupling for sound or stress waves between the transducer 322 and the object 302. If the optional isolation layer 330 is present then the interface surface of the transducer to the structure is 324b.

The transducer assembly 304 may also include a pair of electrically conductive films or patches 328 to connect each of the second contact pads 312 to the actuator or sensor disk 322 through the non-conductive adhesive layer 320. The conductive films or patches 328 may be similar to or the same as conductive films or patches 116 of FIG. 1A.

A transducer assembly installation adhesive 326 may be used to attach each transducer assembly 304 to the object 302. In accordance with an embodiment of the present invention, the transducer assembly 302 is attached to the object 302 without any additional layers or components to provide a substantially flat mating surface 324a (or 324b when optional isolation layer 330 is present), low profile structure when attached to the object 302 for health monitoring to substantially minimize any inadvertent impacts to the transducer assembly 304 that could result in possible damage, help ensure electrical isolation with structure 302, and reduce stress concentrations in the transducer by ensuring a uniform bond, and help ensure consistent bonding with no voids. The compact, minimal layer or ply design also overall minimizes mechanical impedance mismatch for better performance reducing electrical noise susceptibility and increasing the signal-to-noise ratio during the actuating and sensing of the transducer 304 for structural health monitoring or data gathering.

The structural health monitoring unit 314 may be an ultrasonic transceiver, data acquisition unit or similar device for transmitting, receiving and analyzing stress waves, lamb waves, ultrasonic signals, or other non-destructive evaluation (NDE) type signals or waves into the object 302 to detect and locate any anomalies, defect or damage. Accordingly, the system 300 functions as a means to transmit and receive ultrasonic signals efficiently through a structure, such as object 302. The structural health monitoring unit 314 or data acquisition unit may pulse a signal burst with a specified frequency content in the form of varying electrical voltage. The voltage may be sent through the wiring connection including conductive traces 308 to the transducer 322 or sensor. The voltage strains the piezoelectric component of the transducer 322 in a compression mode. This mechanical strain interrogates the object 302 through stress waves, which are omni-directional modes which locally propagate throughout the object 302. Neighboring or adjacent transducers similar to transducer 304 receive the mechanical stress waves and by the reverse piezoelectric effect, electrical voltage is generated and monitored through the transducer assembly 304.

In summary, the present invention provides a low-cost, easy-to-fabricate transducer assembly for monitoring structural health of an object, such as an aircraft or other structure. The low cost permits a multiplicity of such transducer assemblies to be located at strategic positions on the aircraft for structural health monitoring. The transducers are small, do not add appreciable weight and can be easily installed, as described above, as well as removed or replaced quite simply. The transducer assemblies as described herein are highly resistant to environment conditions, such as temperature, moisture, impact damage, chemicals and the like. The transducer assemblies can be electrically isolated from the structure being monitored, although non-isolated embodiments are also possible.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," and "includes" and/or "including" when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A transducer assembly, comprising:
a first layer of dielectric material;

a pair of electrically conductive traces adjacent to the first dielectric layer, wherein each of the electrically conductive traces include a first contact pad and a second contact pad and wherein the first layer of dielectric material includes a pair of vias formed therein to expose each of the first contact pads;

a second layer of dielectric material attached to the first layer of dielectric material with the pair of electrically conductive traces disposed between the first and second layers of dielectric material a pair of holes formed in the second layer of dielectric material;

a transducer attached to an opposite side of the second layer of dielectric material from the first layer of dielectric material; and an electrically conductive patch or paste disposed within each of the pair of holes to electrically connect each second contact pad to the electromechanical transducer, wherein the transducer is attached to the second layer of dielectric material to provide a substantially planar surface with the second layer of dielectric material to prevent any voids or steps.

2. The transducer assembly of claim 1, further comprising another layer of non-conductive material attached to a surface of the transducer opposite to the second layer of dielectric material to isolate a structure being monitored from the transducer.

3. The transducer assembly of claim 2, wherein the other layer of non-conductive material comprises a fiber reinforced resin including a thickness of about 4 mils or less.

4. The transducer assembly of claim 1, wherein the first layer of dielectric material comprises a polyimide film.

5. The transducer of claim 4, wherein the polyimide film has a thickness of about 7.5 mils or less.

6. The transducer assembly of claim 1, wherein the second layer of dielectric material comprises a layer of non-conductive adhesive to encapsulate the electrically conductive traces and to attach the transducer to the first layer of dielectric material and wherein each of the second contact pads is electrically connected through the layer of non-conductive adhesive to the transducer by an electrically conductive adhesive film.

7. The transducer assembly of claim 6, wherein the transducer comprises a signal transmitting face, and wherein the layer of non-conductive adhesive is adapted to attach the transducer to the first layer of dielectric material such that the signal transmitting face of the transducer forms a substantially flat surface with the non-conductive adhesive layer to prevent any voids and to create a uniform bond line when the transducer assembly is attached to an object for structural health monitoring.

8. The transducer assembly of claim 7, wherein the first layer of dielectric material, the pair of electrically conductive traces, the layer of non-conductive adhesive, the electrically conductive film adhesive and the transducer are disposed relative to one another and cured at a predetermined temperature and one of a predetermined vacuum pressure, or a predetermined vacuum pressure and a predetermined autoclave pressure, to form a resulting transducer assembly that is substantially free of any air pockets and resin rich areas.

9. The transducer assembly of claim 6, wherein the layer of non-conductive adhesive includes a thickness of about 4 mils or less.

10. The transducer assembly of claim 1, wherein the transducer comprises a flat electromechanical transducer.

11. The transducer assembly of claim 10, wherein the transducer comprises a ceramic piezoelectric ultrasonic transducer disk with a thickness of about 10 mils or less.

12. The transducer assembly of claim 1, wherein the transducer assembly is attachable to an object for structural health monitoring of the object by an installation adhesive and the first contact pads of the conductive traces are connectable to a structural health monitoring unit without the transducer assembly including any additional layers of material and substantially without any voids between the transducer assembly and the object.

13. A transducer assembly, comprising:

a polyimide film;

a pair of electrically conductive traces bonded to the polyimide film, wherein each of the electrically conductive traces includes a first contact pad and a second contact pad and wherein the polyimide film includes a pair of vias formed therein to expose each of the first contact pads for connection to a structural health monitoring unit;

a layer of non-conductive adhesive attached to the polyimide film and encapsulating the electrically conductive traces in association with the polyimide film;

a flat electromechanical transducer, wherein the layer of non-conductive adhesive is adapted to attach the flat electromechanical transducer to the polyimide film such that a signal transmitting face of the flat electromechanical transducer forms a substantially flat surface with the non-conductive adhesive layer to prevent any voids when the transducer assembly is attached to an object for structural health monitoring; and a pair of electrically conductive adhesive patches to separately connect each of the second contact pads of the electrically conductive traces to the flat electromechanical transducer through the layer of non-conductive adhesive.

14. The transducer assembly of claim 13, wherein the flat electromechanical transducer is attachable to an object for structural health monitoring of the object by an installation adhesive without a structure of the transducer assembly including any additional layers of material to provide a substantially flat structure when attached to the object for structural health monitoring to substantially prevent any inadvertent impacts to the transducer assembly resulting in possible damage to the transducer assembly and to minimize mechanical impedance mismatch and increases a signal-to-noise ratio during structural health monitoring.

15. The transducer assembly of claim 13, wherein each of the first contact pads are connectable to the structural health monitoring unit by one of a connector, a wire soldered to each first contact pad, a wire attached to each first contact pad by a conductive adhesive.

16. The transducer assembly of claim 13, further comprising:

a wire connection to connect each of the first contact pads to the structural health monitoring unit; and an electrical potting compound deposited on the first contact pads and wire connection to seal the transducer assembly from environmental conditions.

17. A system for structural health monitoring, comprising:

a structural health monitoring unit;

a plurality of structural health monitoring transducer assemblies connected to the structural health monitoring unit to send stress waves into an object being monitored and to receive return stress waves from the object for monitoring the structural health of the object, wherein each structural health transducer assembly comprises:

a polyimide film;
a pair of electrically conductive traces attached to the polyimide film, wherein each of the electrically conductive traces include a first contact pad and a second contact pad and wherein the polyimide film includes a pair of vias formed therein to expose each of the first contact pads for connection to the structural health monitoring unit;
a layer of non-conductive adhesive attached to the polyimide film and encapsulating the electrically conductive traces in association with the polyimide film;
a transducer, wherein the layer of non-conductive adhesive is adapted to attach the flat transducer to the polyimide film such that a signal transmitting face of the transducer forms a substantially flat surface with the non-conductive adhesive layer to prevent any voids when the transducer assembly is attached to an object for structural health monitoring; and
a pair of electrically conductive adhesive patches to separately connect each of the second contact pads of the electrically conductive traces to the transducer through the layer of non-conductive adhesive.

18. The system of claim 17, further comprising an installation adhesive to attach each structural health monitoring transducer assembly to the object without a structure of each transducer assembly including any additional layers of material to provide a substantially flat structure and a minimal size when attached to the object for structural health monitoring to substantially reduce a probability of any inadvertent impacts to the transducer assembly that could result in possible damage to the transducer assembly and to minimize mechanical impedance mismatch, reduce electrical noise susceptibility, and increase a signal-to-noise ratio during structural health monitoring.

19. The system of claim 17, wherein the transducer comprises an interface surface including a size to ensure electrical isolation from the object being monitored when bonded to the object with a non-conductive adhesive.

20. The system of claim 17, wherein the object being monitored for structural health comprises one of an aerospace vehicle, a terrestrial vehicle, a watercraft, and a civil structure.

21. The system of claim 17, wherein the transducer comprises a substantially flat ceramic piezoelectric transducer with a thickness of about 10 mils or less.

22. A method for forming a transducer assembly, comprising:
providing a first layer of dielectric material;
placing a pair of electrically conductive traces adjacent to the first dielectric layer, wherein each of the electrically conductive traces includes a first contact pad and a second contact pad;
forming a pair of vias in the first layer of dielectric material to expose each of the first contact pads;
attaching a second layer of dielectric material to the first layer of dielectric material with the pair of electrically conductive traces disposed between the first and second layers of dielectric material; and
attaching a transducer to an opposite side of the second layer of dielectric material; and
electrically connecting each second pad to the transducer by disposing an electrically conductive patch or electrically conductive paste in each via.

23. The method of claim 22, further comprising curing the transducer assembly using a predetermined cure schedule to cause a cured transducer assembly to be substantially free of any air pockets and resin rich areas.

24. The method of claim 23, wherein curing the transducer assembly comprises:
placing an uncured transducer assembly on an autoclave tool separated from the autoclave tool by at least one layer of a heat resistant, non-stick or release material;
placing a temperature tape on an opposite side of the uncured transducer assembly relative to the autoclave tool;
placing a first separator sheet of heat resistant, non-stick or release material on the temperature tape;
placing a bleeder on the first separator sheet to permit applying a fully vacuum to the transducer assembly;
placing a second separator sheet of heat resistant, non-stick or release material on the bleeder;
placing an airweave breather on the second separator sheet; and
attaching a vacuum bag to apply a full vacuum to the transducer assembly.

25. The method of claim 23, further comprising:
applying a full vacuum to an uncured transducer assembly;
ramping up a curing temperature applied to the uncured transducer assembly at about 20 degrees Fahrenheit per minute from ambient temperature to about 300 degrees Fahrenheit;
holding the curing temperature at about 300 degrees Fahrenheit for about 30 minutes; and
ramping down the curing temperature at about 20 degrees Fahrenheit per minute to about ambient temperature.

26. A method for forming a transducer, comprising:
providing a polyimide film;
bonding a pair of electrically conductive traces to the polyimide film, wherein each of the electrically conductive traces include a first contact pad and a second contact pad;
forming a pair of vias in the polyimide film to expose each of the first contact pads for connection to a structural health monitoring unit;
attaching a layer of non-conductive adhesive to the polyimide layer and encapsulating the electrically conductive traces between the non-conductive adhesive layer and the polyimide film;
attaching a flat transducer to the polyimide film by the layer of non-conductive adhesive, wherein the layer of non-conductive adhesive is adapted to attach the flat transducer to the polyimide film such that a signal transmitting face of the flat transducer forms a substantially flat surface with the non-conductive adhesive layer to prevent any voids when the transducer assembly is attached to an object for structural health monitoring; and
separately connecting each of the second contact pads of the electrically conductive traces to the flat transducer through the layer of non-conductive adhesive by an electrically conductive adhesive patch.

27. A method for monitoring structural health, comprising attaching an array of transducer assemblies to an object for monitoring the structural health of the object, each transducer assembly comprising a structure to substantially minimize mechanical impedance mismatch and increase a signal-to-noise ratio during monitoring of the object, the structure comprising:
a polyimide film;
a pair of electrically conductive traces bonded to the polyimide film, wherein each of the electrically conductive traces include a first contact pad and a second contact pad and wherein the polyimide film includes a pair of vias formed therein to expose each of the first contact pads for connection to a structural health monitoring unit;

a layer of non-conductive adhesive attached to the polyimide film and encapsulating the electrically conductive traces in association with the polyimide film;

a transducer, wherein the layer of non-conductive adhesive is adapted to attach the transducer to the polyimide film such that a signal transmitting face of the transducer forms a substantially flat surface with the non-conductive adhesive layer to prevent any voids when the transducer assembly is attached to an object for structural health monitoring; and a pair of electrically conductive adhesive patches to separately connect each of the second contact pads of the electrically conductive traces to the transducer through the layer of non-conductive adhesive; and utilizing the array of transducer assemblies to monitor the structural health of the object.

28. The method of claim 27, further comprising:
attaching each transducer assembly to the object by an installation adhesive; and
connecting each of the first contact pads of the conductive traces to the structural health monitoring unit without the transducer assembly including any additional layers of material and substantially without any voids between the transducer assembly and the object.

29. The method of claim 27, wherein attaching the array of transducer assemblies to an object to be monitored comprises attaching the array of transducer assemblies to one of an aerospace vehicle, terrestrial vehicle, a watercraft, and a civil structure.

* * * * *